(12) United States Patent
Ko

(10) Patent No.: US 6,652,697 B2
(45) Date of Patent: Nov. 25, 2003

(54) METHOD FOR MANUFACTURING A COPPER-CLAD LAMINATE

(75) Inventor: Chien-Hsin Ko, Chungli (TW)

(73) Assignee: Pioneer Technology Engineering Co., Ltd., Taoyuan Hsien (TW)

( * ) Notice: Subject to any disclaimer, the term of this patent is extended or adjusted under 35 U.S.C. 154(b) by 175 days.

(21) Appl. No.: 10/007,950

(22) Filed: Dec. 3, 2001

(65) Prior Publication Data

US 2003/0102074 A1 Jun. 5, 2003

(51) Int. Cl.[7] ............................................... B32B 31/20
(52) U.S. Cl. ..................... 156/233; 156/247; 156/289; 156/150; 427/96; 427/124; 427/146; 427/208; 427/404
(58) Field of Search ............................... 156/230, 233, 156/247, 289, 150; 427/96, 123–124, 146–148, 208, 404–405

(56) References Cited

U.S. PATENT DOCUMENTS

| | | | | |
|---|---|---|---|---|
| 4,088,544 A | * | 5/1978 | Hutkin | 428/545 |
| 5,096,522 A | * | 3/1992 | Kawachi et al. | 156/151 |

* cited by examiner

Primary Examiner—Sam Chuan Yao
(74) Attorney, Agent, or Firm—Merchant & Gould, P.C.

(57) ABSTRACT

A method for manufacturing a copper-clad laminate includes the steps of forming first and second metal films on first and second carriers, forming first and second copper films on the first and second metal films, forming first and second semi-cured resin layers, stacking a first assembly of the first carrier, the first metal film, the first copper film and the first semi-cured resin layer on a second assembly of the second carrier, the second metal film, the second copper film and the second semi-cured resin layer, and vacuum hot pressing the first and second assemblies so as to complete cure and integrate the first and second semi-cured resin layers.

9 Claims, 3 Drawing Sheets

METHOD FOR MANUFACTURING A COPPER-CLAD LAMINATE

BACKGROUND OF THE INVENTION

1. Field of the Invention

This invention relates to a method for manufacturing a copper-clad laminate with ultra-thin copper films.

2. Description of the Related Art

Copper-clad laminates are used in the production of printed circuit boards. It is desirable to use relatively thin copper foils (less than 16 microns) on the copper-clad laminates for the production of printed circuit boards with compact and highly integrated circuit patterns thereon due to drawbacks, such as side etching effect during etching process for the formation of circuit lines on the printed circuit boards, and time consuming and undesirable enlargement of through-holes during the process of the formation of the through-holes in the printed circuit boards via laser beam, which are consequences of using thick copper foils in the processing of the printed circuit boards. However, conventionally, copper foils are made by electrodeposition techniques and are hard to produce with the desired thickness without formation of pinholes. Moreover, even if such thin copper foils can be produced, they are difficult to store and transport, and are susceptible to folding when laminated with a substrate (which is generally called a prepreg that is in the form of a fabric sheet coated with curable epoxy resin or a glass-fiber reinforced curable epoxy resin sheet) during a hot pressing step. A conventional process for the production of printed circuit boards involves forming relatively thick copper foils on a glass-fiber reinforced epoxy resin substrate and subsequently etching the copper foils to achieve the desired thickness. As a consequence, the process induces environmental problems and results in uneven surfaces for the copper foils.

SUMMARY OF THE INVENTION

Therefore, the object of the present invention is to provide a method for manufacturing a copper-clad laminate with ultra-thin copper films that is capable of overcoming the aforementioned drawbacks.

According to the present invention, a method for manufacturing a copper-clad laminate comprises the steps of: preparing rigid plate-shaped first and second carriers having first and second flat surfaces, respectively; forming first and second thin metal films on the first and second flat surfaces of the first and second carriers, respectively; forming ultra-thin first and second copper films on the first and second thin metal films, respectively, via electroplating techniques; coating curable first and second resin layers on the first and second copper films, respectively; heating the first and second resin layers so as to form hardened first and second semi-cured resin layers on the first and second copper films, respectively; stacking a first assembly of the first carrier, the first thin metal film, the first copper film, and the first semi-cured resin layer on a second assembly of the second carrier, the second thin metal film, the second copper film, and the second semi-cured resin layer in a manner that the first and second semi-cured resin layers are brought into contact; hot pressing the first and second assemblies so as to completely cure and integrate the first and second semi-cured resin layers to form a cured resin body that is bonded to and that cooperates with the first and second copper films of the first and second assemblies to form a laminated body; and removing the first and second carriers together with the first and second thin metal films from the laminated body.

BRIEF DESCRIPTION OF THE DRAWINGS

In drawings which illustrate an embodiment of the invention.

DETAILED DESCRIPTION OF THE PREFERRED EMBODIMENT

Figure 1:
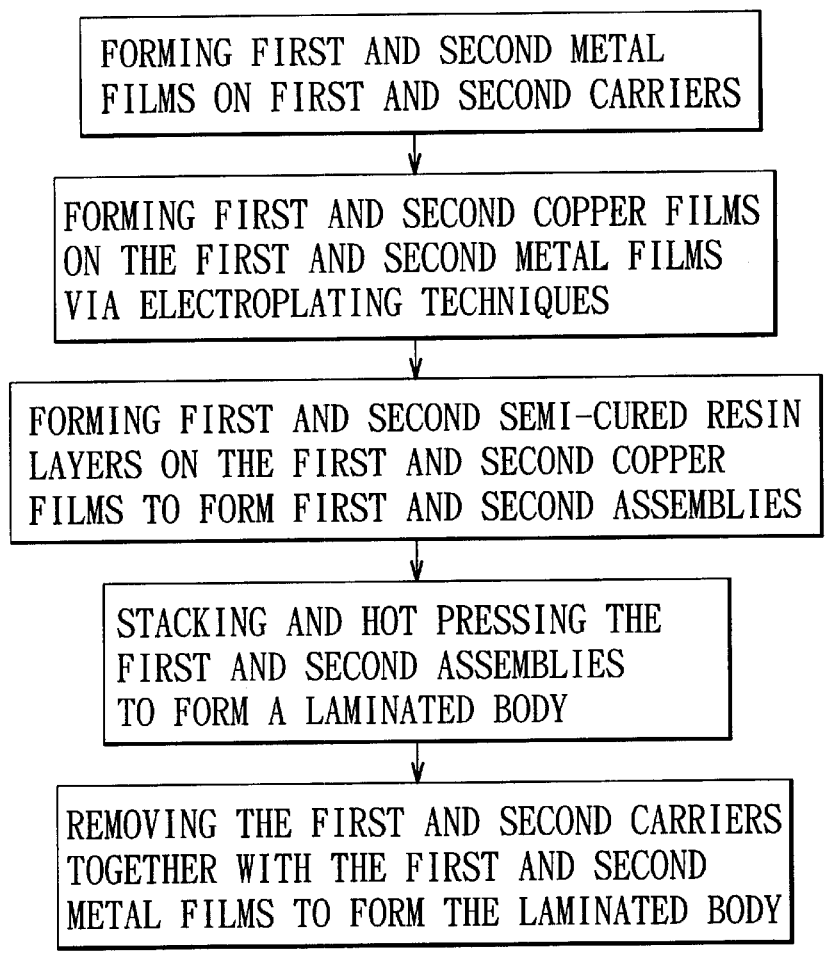
FIG. 1 is a block diagram to illustrate consecutive steps for forming a copper-clad laminate according to the preferred embodiment of a method of this invention.
Figure 2:
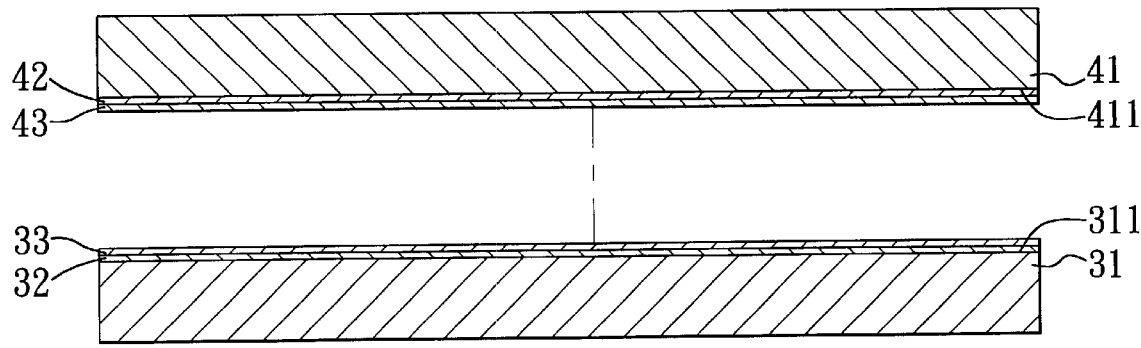
FIG. 2 illustrates the formation of first and second thin metal films and ultra-thin first and second copper films on rigid plate-shaped first and second carriers according to the preferred embodiment.
Figure 3:
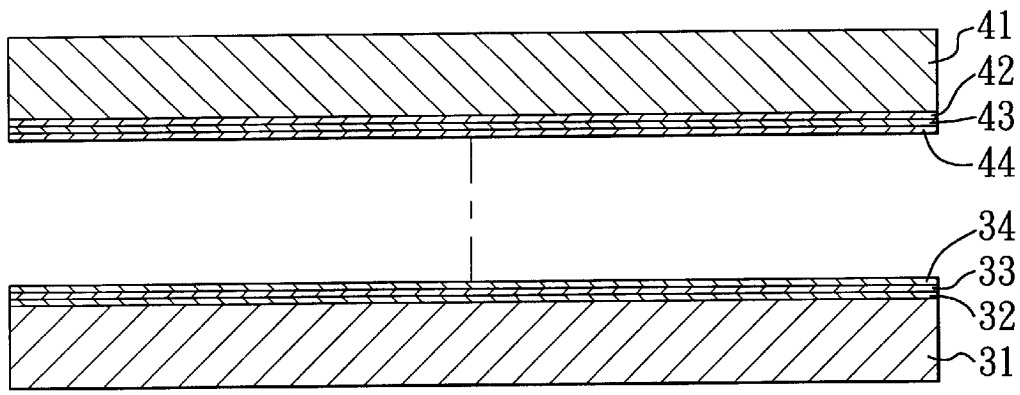
FIG. 3 illustrates the formation of glass-fiber reinforced first and second inner resin layers on the first and second copper films of FIG. 2 according to the preferred embodiment.
Figure 4:
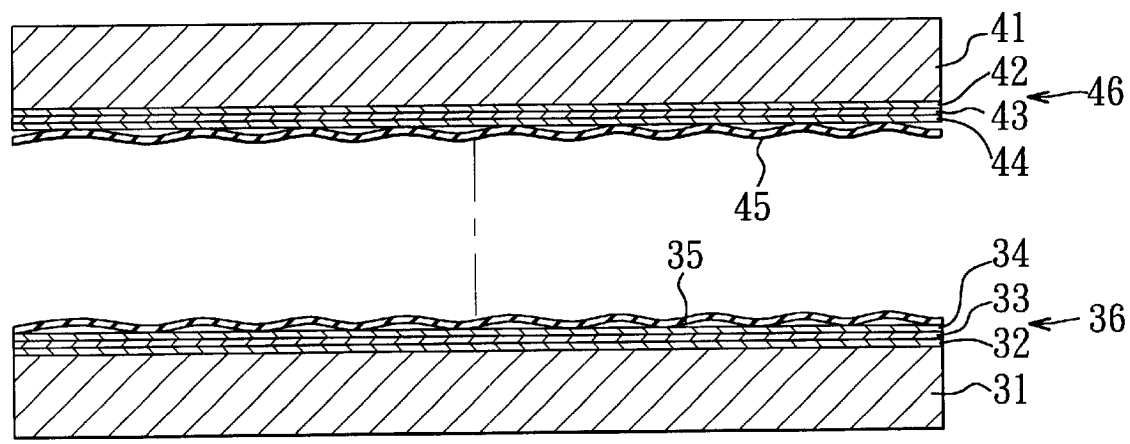
FIG. 4 illustrates the formation of glass-fiber reinforced first and second outer resin layers on the first and second inner resin layers of FIG. 3 according to the preferred embodiment.
Figure 5:
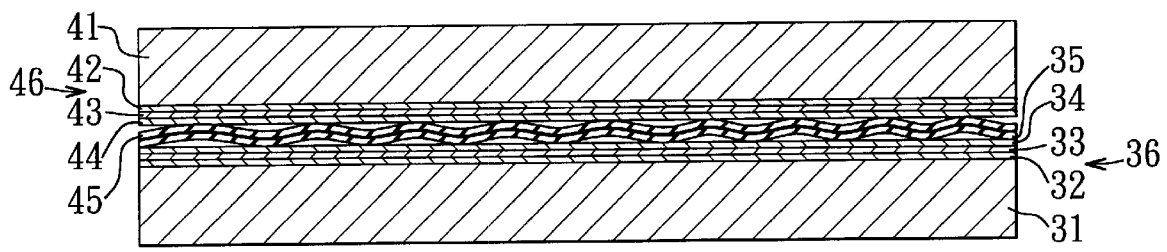
FIG. 5 illustrates the step of stacking the thus formed first assembly of the first carrier, the first thin metal film, the first copper film and the first inner and outer resin layers on the second assembly of the second carrier, the second thin metal film, the second copper film and the second inner and outer resin layers in FIG. 4 according to the preferred embodiment.

FIG. 1 illustrates consecutive steps for forming the preferred embodiment of a copper-clad laminate 6 (see FIG. 6) according to the method of this invention.

Figure 6:
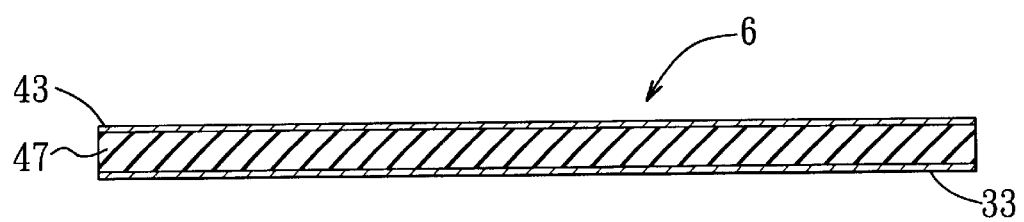
FIG. 6 illustrates the formation of a final product of a copper-clad laminate by vacuum hot pressing the stacked assemblies of FIG. 5 according to the preferred embodiment.

With further reference to FIGS. 2 to 6, the method includes the steps of: preparing rigid plate-shaped first and second carriers 31, 41 having first and second flat surfaces 311, 411, respectively; cleaning the first and second flat surfaces 311, 411; roughening the first and second flat surfaces 311, 411; forming first and second thin metal films 32, 42 on the first and second flat surfaces 311, 411 of the first and second carriers 31, 41 (see FIG. 2) respectively; forming ultra-thin first and second copper films 33, 43 on the first and second thin metal films 32, 42 (see FIG. 2), respectively, via electroplating techniques; coating curable first and second inner resin layers 34, 44 on the first and second copper films 33, 43 (see FIG. 3), respectively; heating the first and second inner resin layers 34, 44 so as to form hardened first and second cured inner resin layers 34, 44 on the first and second copper films 33, 43, respectively; coating curable first and second outer resin layers 35, 45 on the first and second cured inner resin layers 34, 44 (see FIG. 4), respectively; heating the first and second outer resin layers 35, 45 so as to form hardened first and second semi-cured outer resin layers 35, 45 on the first and second cured inner resin layers 34, 44, respectively; stacking a first assembly 36 of the first carrier 31, the first thin metal film 32, the first copper film 33, the first cured inner resin layer 34, and the first semi-cured outer resin layer 35 on a second assembly 46 of the second carrier 41, the second thin metal film 42, the second copper film 43, the second cured inner resin layer 44, and the second semi-cured outer resin layer 45 in a manner that the first and second semi-cured outer resin layers 35, 45 are brought into contact (see FIG. 5); vacuum hot pressing the first and second assemblies 36, 46 in a hot press apparatus (not shown) so as to completely cure and integrate the first and second semi-cured outer resin layers 35, 45 and the first and second inner resin layers 34, 44 to form a cured resin body 47 that is bonded to and that cooperates with the first and second copper films 33, 43 of the first and second assemblies 36, 46 to form a laminated body; cooling and subsequently removing the first and second carriers 31, 41 together with the first and second thin metal films 32, 42 from the laminated body by peeling so as to form the final product of the copper-clad laminate 6 (see FIG. 6).

Each of the first and second carriers 31, 41 is made from a material selected from a group consisting of aluminum, copper, iron, high density polyethylene, cured glass-fiber reinforced epoxy resin, fluorocarbon polymers, and Bakelite, such as polyethylene, polypropylene, polystyrene, etc.

The cleaning of the first and second flat surfaces 311, 411 of the first and second carriers 31, 41 can be carried out via known cleaning techniques, such as washing with detergents and water and treating with ultraviolet rays and ozone or with plasma.

The purpose of roughening the first and second flat surfaces 311, 411 of the first and second carriers 31, 41 is to enhance bonding strengths between the first flat surface 311 and the first thin metal film 32 and between the second flat surface 411 and the second thin metal film 42. Surface roughening can be carried out via chemical treatment with acids, such as diluted sulfuric acid and aqueous sodium hydroxide solution, or via physical treatment with ultraviolet rays and ozone or plasma.

Each of the first and second thin metal films 32, 42 can be formed by physical vapor deposition techniques, such as vacuum plating, vacuum sputtering, and ion plating.

Preferably, each of the first and second thin metal films 32, 42 is made from a metal selected from a group consisting of chromium, zinc, nickel, titanium, and alloys thereof.

Since each of the first and second copper films 33, 43 is formed via electroplating techniques, the thickness thereof can be controlled to be less than 6 microns.

The first and second inner resin layers 34, 44 and the first and second outer resin layers 35, 45 are made from a curable resin material, such as modified epoxy resin and glass-fiber reinforced epoxy resin.

The vacuum hot pressing of the first and second assemblies 36, 46 is preferably carried out in a two-stage manner such that the hot pressing temperature is maintained at 150° C. during a first stage for reaching a uniform distribution of the first and second semi-cured outer resin layers 35, 45 between the first and second inner resin layers 34, 44 and at 180° C. during a second stage for completely curing and integrating the first and second semi-cured outer resin layers 35, 45.

By using the method of this invention to form the ultra-thin copper films on a substrate for the production of printed circuit boards, the drawbacks as encountered in the prior art can be eliminated.

With the invention thus explained, it is apparent that various modifications and variations can be made without departing from the spirit of the present invention. It is therefore intended that the invention be limited only as recited in the appended claims.

I claim:

1. A method for manufacturing a copper-clad laminate, comprising the steps of:

preparing rigid plate-shaped first and second carriers having first and second flat surfaces, respectively;

forming first and second thin metal films on said first and second flat surfaces of said first and second carriers, respectively;

forming ultra-thin first and second copper films on said first and second thin metal films, respectively, via electroplating techniques;

coating curable first and second resin layers on said first and second copper films, respectively;

heating said first and second resin layers so as to form hardened first and second semi-cured resin layers on said first and second copper films, respectively;

stacking a first assembly of said first carrier, said first thin metal film, said first copper film, and said first semi-cured resin layer on a second assembly of said second carrier, said second thin metal film, said second copper film, and said second semi-cured resin layer in a manner that said first and second semi-cured resin layers are brought into contact;

hot pressing said first and second assemblies so as to completely cure and integrate said first and second semi-cured resin layers to form a cured resin body that is bonded to and that cooperates with said first and second copper films of said first and second assemblies to form a laminated body; and removing said first and second carriers together with said first and second thin metal films from said laminated body.

2. The method of claim 1, wherein each of said first and second copper films has a thickness less than 6 microns.

3. The method of claim 1, wherein each of said first and second thin metal films is formed by vapor deposition.

4. The method of claim 2, wherein each of said first and second thin metal films is formed by vacuum plating.

5. The method of claim 2, wherein each of said first and second thin metal films is formed by vacuum sputtering.

6. The method of claim 2, wherein each of said first and second thin metal films is formed by ion plating.

7. The method of claim 1, wherein each of said first and second resin layers is made from glass-fiber reinforced epoxy resin.

8. The method of claim 1, wherein each of said first and second carriers is made from a material selected from a group consisting of aluminum, copper, iron, high density polyethylene, polypropylene, cured glass-fiber reinforced epoxy resin, and fluorocarbon polymers.

9. The method of claim 8, wherein each of said first and second thin metal films is made from a metal selected from a group consisting of chromium, zinc, nickel, titanium, and alloys thereof.

* * * * *